(12) United States Patent
Kim et al.

(10) Patent No.: US 10,901,007 B2
(45) Date of Patent: Jan. 26, 2021

(54) RF SENSING APPARATUS OF PLASMA PROCESSING CHAMBER AND PLASMA PROCESSING CHAMBER INCLUDING SAME

(71) Applicant: SAMSUNG ELECTRONICS CO., LTD., Suwon-si (KR)

(72) Inventors: Young Do Kim, Hwaseong-si (KR); Sung Yong Lim, Seoul (KR); Chan Soo Kang, Hwaseong-si (KR); Do Hoon Kwon, Suwon-si (KR); Min Ju Kim, Seoul (KR); Sang Ki Nam, Seongnam-si (KR); Jung Mo Yang, Pyeongtaek-si (KR); Jong Hun Pi, Gyeongsangbuk-do (KR); Kyu Hee Han, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 85 days.

(21) Appl. No.: 16/261,175

(22) Filed: Jan. 29, 2019

(65) Prior Publication Data
US 2020/0072874 A1    Mar. 5, 2020

(30) Foreign Application Priority Data

Aug. 28, 2018    (KR) .......................... 10-2018-0101556

(51) Int. Cl.
| | | |
|---|---|---|
| *G01R 15/18* | (2006.01) | |
| *H05H 1/46* | (2006.01) | |
| *H01F 27/28* | (2006.01) | |
| *G01R 15/16* | (2006.01) | |

(52) U.S. Cl.
CPC .......... *G01R 15/181* (2013.01); *G01R 15/165* (2013.01); *H01F 27/2804* (2013.01); *H05H 1/46* (2013.01)

(58) Field of Classification Search
CPC ...... G01R 15/181; G01R 15/165; H05H 1/46; H05H 1/0018; H05H 1/0012; H01F 27/2804; H01J 37/32082; H01J 37/32917; H01J 37/32935
See application file for complete search history.

(56) References Cited

U.S. PATENT DOCUMENTS

| | | |
|---|---|---|
| 7,307,410 B2 | 12/2007 | Shiokawa et al. |
| 8,179,122 B2 | 5/2012 | Ibuki |
| 8,937,480 B2 | 1/2015 | Tabuchi |

(Continued)

FOREIGN PATENT DOCUMENTS

| | | |
|---|---|---|
| JP | 2009085783 A | 4/2009 |
| KR | 1020050024515 A | 3/2005 |

*Primary Examiner* — Akm Zakaria
(74) *Attorney, Agent, or Firm* — Volentine, Whitt & Francos, PLLC

(57) ABSTRACT

An RF sensing apparatus configured for use with a plasma processing chamber includes a penetration unit opened in an up/down direction, a main return path unit surrounding all or a portion of the penetration unit, and a secondary return path unit located between the penetration unit and the main return path unit, spaced apart from the main return path unit, and surrounding all or a portion of the penetration unit. The main return path unit and the secondary return path unit include a path through which a current flows in one of the up/down directions.

19 Claims, 10 Drawing Sheets

(56) References Cited

U.S. PATENT DOCUMENTS

| | | | | |
|---|---|---|---|---|
| 2003/0184940 A1* | 10/2003 | Staver | ............ | H02H 1/066 |
| | | | | 361/93.6 |
| 2012/0223697 A1 | 9/2012 | Lee et al. | | |
| 2014/0049250 A1* | 2/2014 | Brown | ............ | G01R 15/181 |
| | | | | 324/127 |
| 2019/0350072 A1* | 11/2019 | Dorf | ............ | H05H 1/46 |

\* cited by examiner

RF SENSING APPARATUS OF PLASMA PROCESSING CHAMBER AND PLASMA PROCESSING CHAMBER INCLUDING SAME

CROSS-REFERENCE TO RELATED APPLICATION(S)

This application claims benefit of priority to Korean Patent Application No. 10-2018-0101556 filed on Aug. 28, 2018 in the Korean Intellectual Property Office, the disclosure of which is incorporated herein by reference in its entirety.

BACKGROUND

1. Field

Embodiments of the inventive concept relate to Radio Frequency (RF) sensing apparatus(es) that may be used in a plasma processing chamber. More particularly, embodiments of the inventive concept relate to RF sensing apparatus(es) capable of materially reducing a change in the before and after electrical characteristics of the plasma processing chamber resulting from the introduction of the RF sensor into the plasma processing chamber.

2. Description of Related Art

Plasma processing chambers are commonly used during the fabrication of semiconductor devices. When an RF sensing apparatus is introduced (e.g., inserted or mounted) into a plasma processing chamber in order to obtain RF measurement data it inevitably changes the electrical characteristics (e.g., the impedance) of the plasma processing chamber. That is, for example, when an electrical coil is inserted into a plasma processing chamber, the physical nature (i.e., hardware) of the coil will cause changes in the RF environment. Such changes in the RF environment of the plasma processing chamber may undesirably change the outcomes of process(es) being run in the plasma processing chamber. An approach is needed whereby the altering effects of introducing an RF sensing apparatus into a plasma processing chamber may be mitigated.

SUMMARY

In one aspect of the inventive concept, an RF sensing apparatus is provided that minimizes changes in the electrical characteristics of a plasma processing chamber due to the introduction of the RF sensing apparatus. As a result, RF measurement are more accurate and processes performed by the plasma processing chamber run closer to specifications.

Certain embodiments of the inventive concept provide an RF sensing apparatus introduced to a plasma processing chamber. The RF sensing apparatus includes; a penetration unit configured to receive a conducting rod extending through the penetration unit in an up/down direction, a main return path unit at least partially encompassing the penetration unit, and a secondary return path unit disposed between the penetration unit and the main return path unit, spaced apart from the main return path unit by a separation space, and at least partially surrounding the penetration unit, wherein the main return path unit and the secondary return path unit form a return current path through which a return current flows in one of the up direction and down direction.

Certain embodiments of the inventive concept provide an RF sensing apparatus introduced to a plasma processing chamber. The RF sensing apparatus includes; a conducting rod through which a conducting rod current flows in one direction, a current return unit through which a return current flows in another direction opposite the one direction, that at least partially encompasses the conducting rod, that is physically separated from the conducting rod, and that includes a main return path unit and an secondary return path unit, and a current sensing unit disposed between the main return path unit and the secondary return path unit, wherein a remaining portion of the return current flowing in the secondary return path unit is less than a majority of the return current flowing in the main return path unit.

Certain embodiments of the inventive concept provide an RF sensing apparatus introduced to a plasma processing chamber. The RF sensing apparatus includes; a main return path unit having a centrally disposed through-hole in an up/down direction and electrically conducting a first current in the up/down direction, an secondary return path unit spaced apart from an inner side surface of the main return path unit, having a centrally disposed through-hole in the up/down direction, and electrically conducting a second current in the up/down direction, and a coil-type wiring disposed between the main return path unit and the secondary return path unit.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1A:
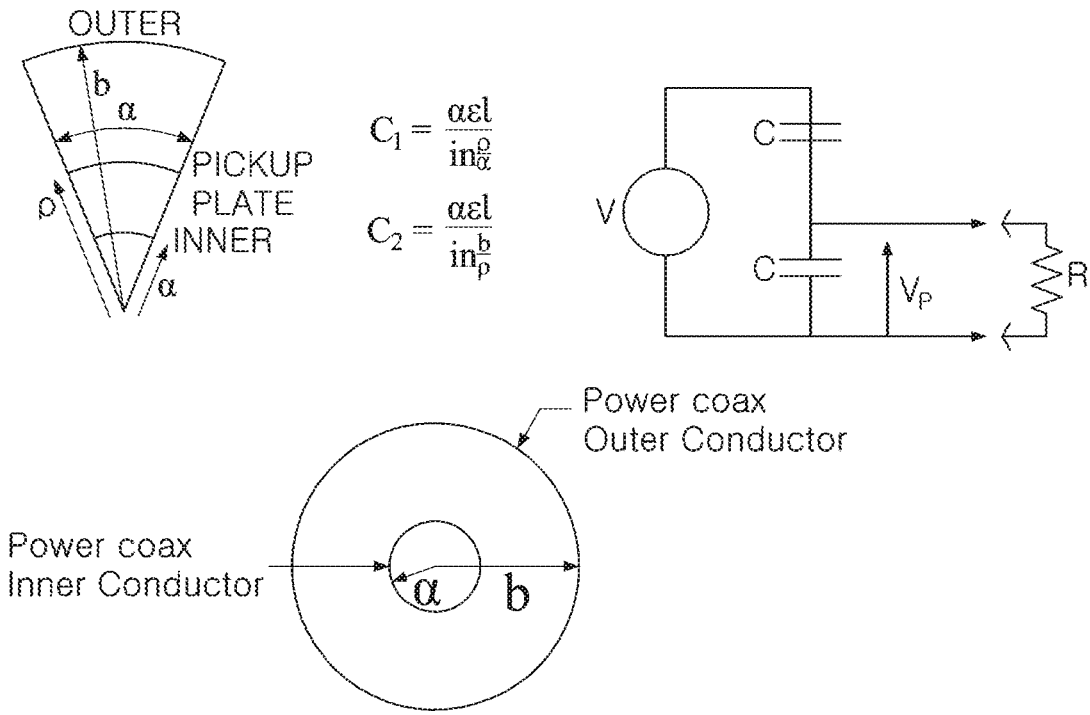
FIG. 1, inclusive of FIGS. 1A and 1B, illustrates certain basic electrical principle(s) associated with n RF sensor pick-up structure into a plasma processing chamber.

Certain illustrated embodiments of the inventive concept will be described hereafter with reference to the accompanying drawings.

Various advantages and features, as well as the manner of achieving same in the context of the inventive concept, will be appreciated upon consideration of the illustrated embodiments. Those skilled in the art will further appreciate that embodiments of the inventive concept may be variously implemented in a variety of forms. Hence, the scope of the inventive concept is not limited to only the illustrated embodiments. Rather, these embodiments are provided so that this disclosure of the inventive concept will be thorough and complete, and will fully convey the scope of the inventive concept to those skilled in the art. The scope of the inventive concept defined by the claims that follow and their equivalent(s). Throughout the written description, like reference numerals are used to denote like or similar elements.

As noted above, certain embodiments of the inventive concept provide Radio Frequency (RF) sensing apparatus(es) that may be advantageously used in various semiconductor fabrication chambers, such as chamber(s) in which a plasma is generated (hereafter, plasma processing chamber). Certain RF sensing apparatus(es) consistent with the inventive concept are capable of significantly mitigating a process change rate that may otherwise occur when a sensor (e.g., a hardware pick-up structure) is introduced into the plasma processing chamber in order to detect/collect RF signal information.

Figure 1B:
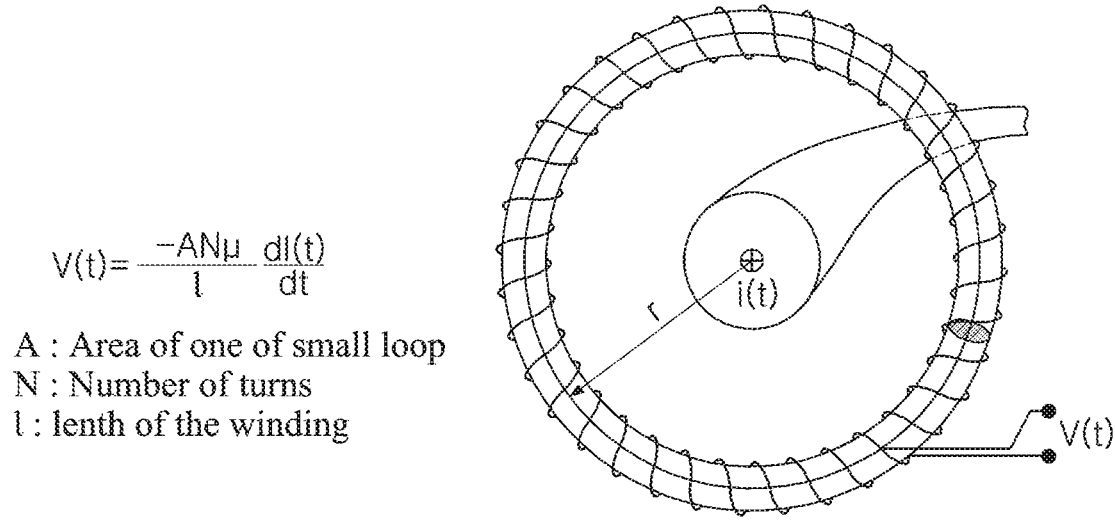

Figure (FIG.) 1, inclusive of FIGS. 1A and 1B, illustrates certain basic electrical principle(s) associated with the provisioning of a sensor pick-up structure (e.g., an RF sensing apparatus used to detect/collect various voltage and/or current signals) within a plasma processing chamber. For example, an electrical coil (FIGS. 1A and 1B) may be inserted within the plasma processing chamber to collect a current signal. However, this insertion (i.e., a hardware alteration of the existing electrical environment or path) necessarily changes the plasma processing chamber environment, thereby changing any process (i.e., a process change rate) performed by the plasma processing chamber from a set of conditions defined in the absence of the inserted hardware. In order to significantly reduce the resulting process change rate, it is necessary to account for difference(s) in a set of before conditions (i.e., electrical characteristics of the plasma processing chamber before insertion of the RF sensing apparatus) and a corresponding set of after conditions (i.e., electrical characteristics of the plasma processing chamber after insertion of the RF sensing apparatus).

Those skilled in the art will recognize that the electrical characteristics of the plasma processing chamber may be defined, at least in part, by the capacitive relationships shown in FIG. 1A in relation to a coaxial (or coax) conductor having an inner conductive element (radius $\alpha$) and an outer conductive element (radius b), as well as the voltage/current relationship of FIG. 1B.

Figure 2:
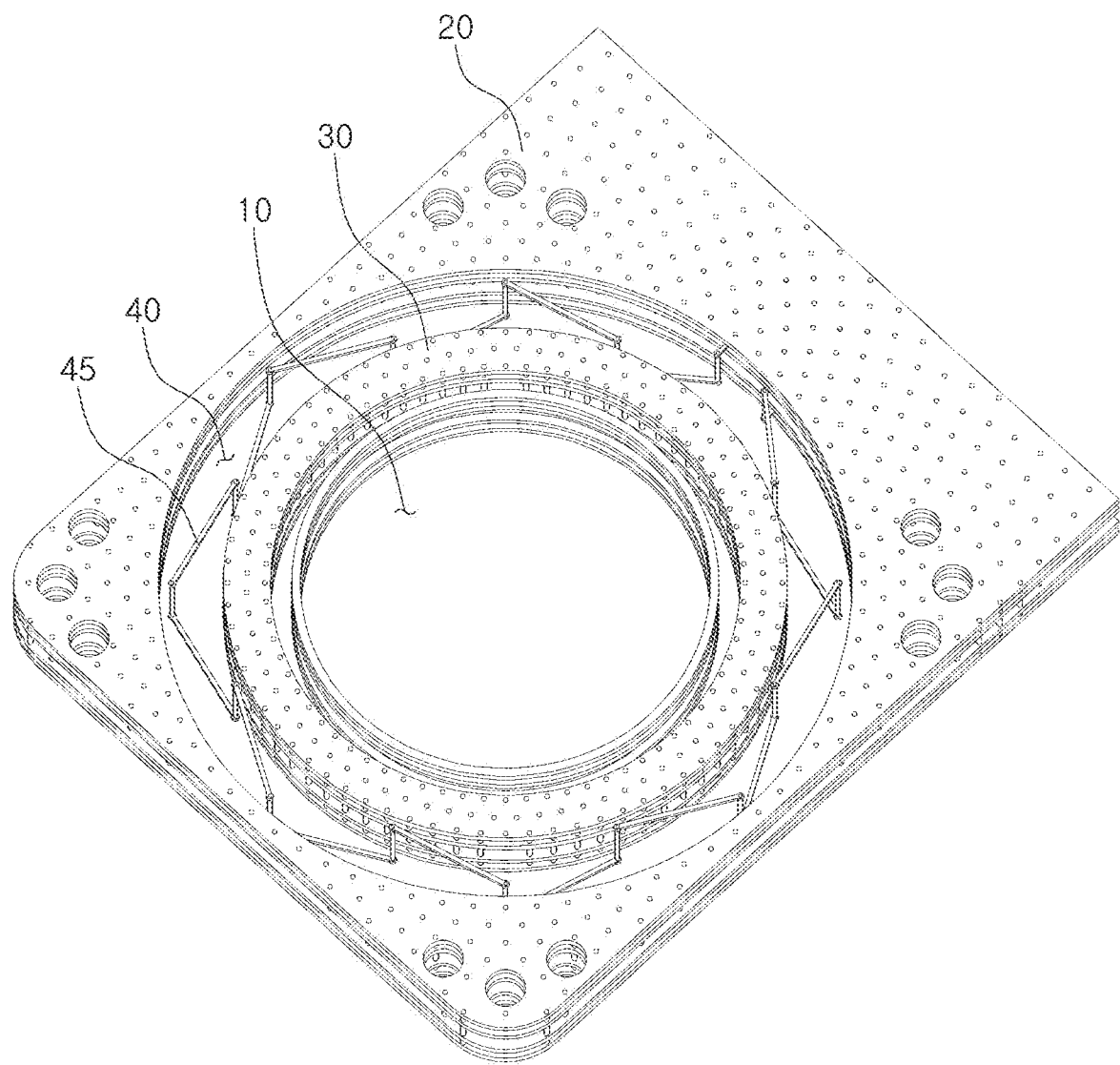
FIG. 2 is a perspective view of an RF sensing apparatus according to an embodiment of the inventive concept.

FIG. 2 is a perspective view of an RF sensing apparatus that may be used in a plasma processing chamber in certain embodiments of the inventive concept.

Referring to FIG. 2, the RF sensing apparatus includes a penetration unit 10 and a current return path unit, where the current return path unit includes a main return path unit 20 and a secondary return path unit 30.

Here, the penetration unit 10 is configured to receive a current-carrying conducting rod (not shown in FIG. 2). That is, the penetration unit 10 provides a void (or an opening) through which the conducting rod may be introduced (i.e., inserted). Hereafter, the extension direction of the conducting rod through the penetration unit 10 will be referred to as an up/down direction. In this regard, an electrical current flowing through a conducting rod (hereafter, a conducting rod current) may be understood as flowing in either an up direction or an opposing down direction at any given time. As will be appreciated by those skilled in the art, this designation of the up/down direction is arbitrary and is made in relation to other elements in order to more clearly teach the making and use of the inventive concept. Further, the use of a conducting rod as a particular structure is merely one approach that may be used to introduce a current associated with an RF measurement into the plasma processing chamber. Accordingly, the conducting rod current may be understood as merely one type of first measurement current used in various embodiments of the inventive concept.

The main return path unit 20 has a structure encompassing all or part of the penetration unit 10. FIG. 2 specifically illustrates one example of the main return path unit 20 that fully encompasses all of the penetration unit 10, but the inventive concept is not limited thereto. In other embodiments of the inventive concept the main return path unit 20 may only partially encompass the penetration unit 10. Thus, the main return path unit 20 may be said to "at least partially encompass" the penetration unit 10.

In contrast, the secondary return path unit 30 has a structure circumferentially surrounding all or part of the penetration unit 10, while also being physically spaced apart from the main return path unit 20. Thus, the secondary return path 30 may be said to disposed between the penetration unit 10 and the main return path unit 20 and "at least partially surrounding" the penetration unit 10.

The RF sensing apparatus of FIG. 2 further includes a current sensing unit 40 is disposed in a "separation space" between the secondary return path unit 30 and the main return path unit 20. In certain embodiments of the inventive concept, the current sensing unit 40 includes a coil-type wiring 45.

In combination, the main return path unit 20 and secondary return path unit 30 define a "return current" path (a direction in which electrical flows—e.g., the up/down direction) for return current (i.e., a second current) substantially equal in magnitude to the first current flowing through the conductive rod that is inserted through the penetration unit 10. This arrangement allows the conducting rod current to "return" through a combination of the main return path unit 20 and secondary return path unit 30.

In other words, the main return path unit 20 has a through-hole opened in an up/down direction in a central portion thereof and has a structure electrically conducting in the up/down direction. In addition, the secondary return path unit 30 also has a through-hole opening in an up/down direction in a central portion thereof, has a structure electrically conducting in the up/down direction, is located inside the main return path unit 20, and is disposed in a manner spaced apart from an inner side surface of the main return path unit 20.

Figure 3:
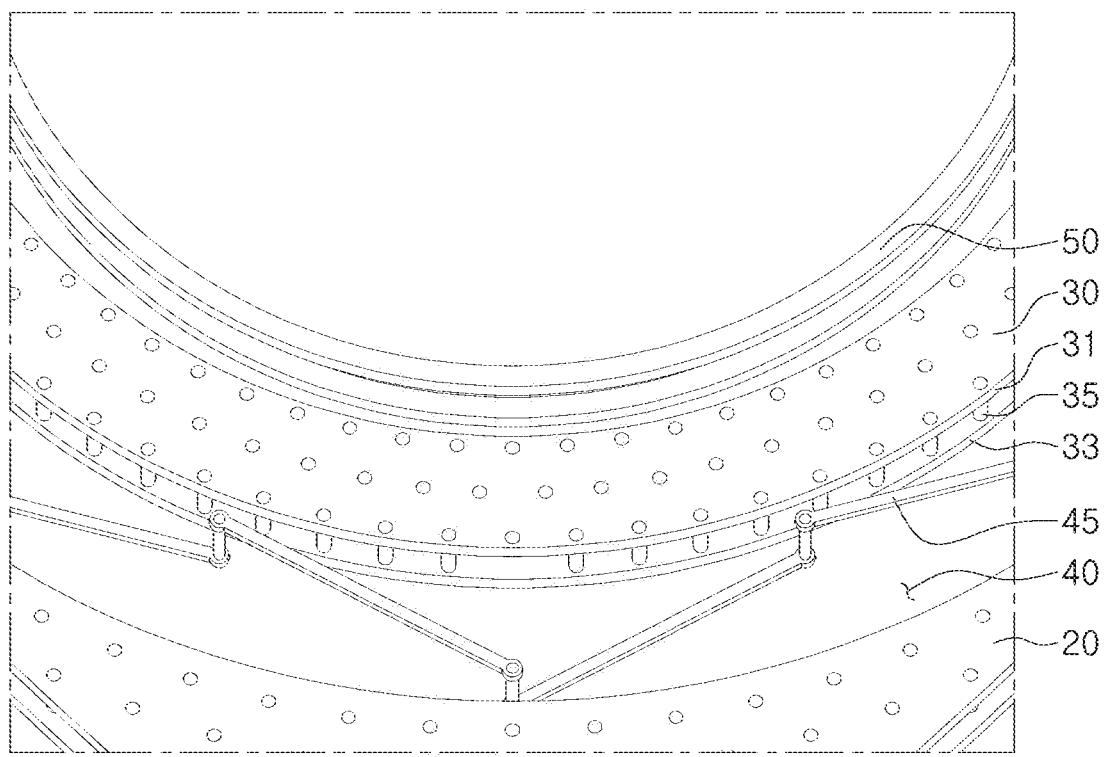
FIGS. 3 and 4 are selectively-enlarged, partial perspective views of the RF sensing apparatus of FIG. 2.
Figure 4:
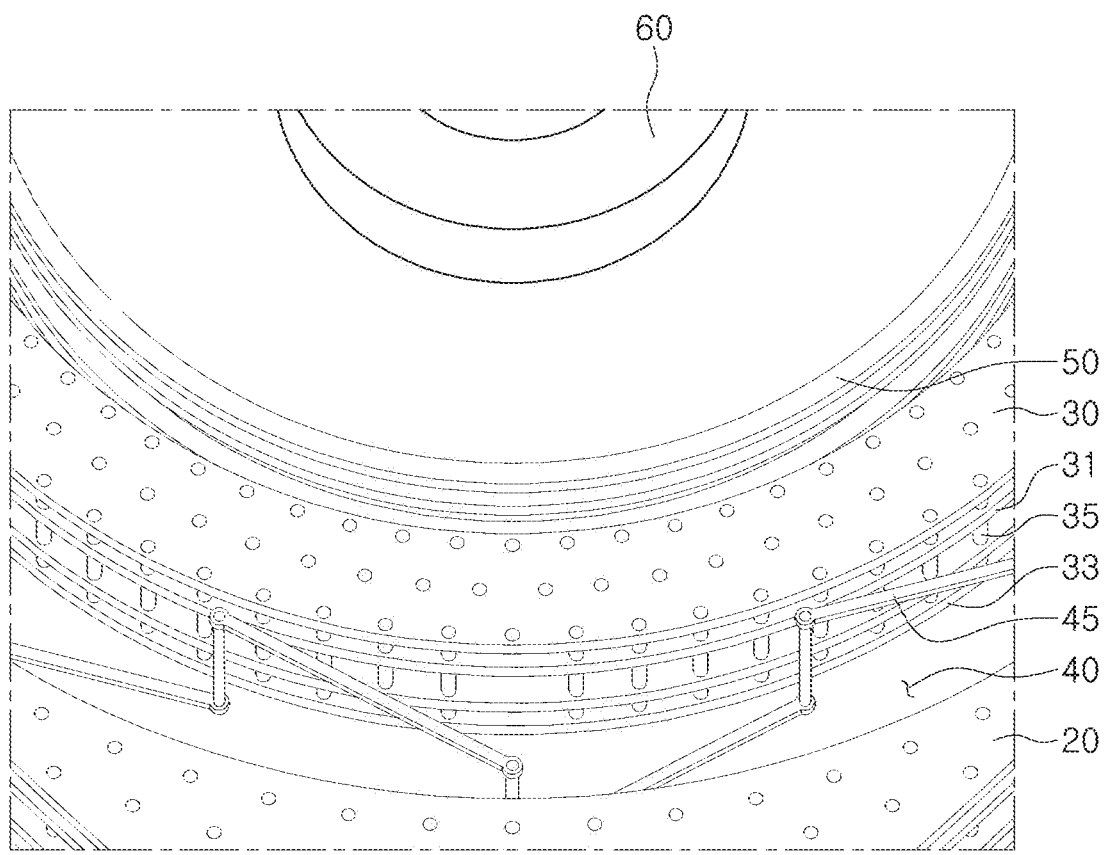

FIGS. 3 and 4 are respective, selectively enlarged, partial perspective views of the RF sensing apparatus of FIG. 2.

Referring to FIG. 3, the secondary return path unit 30 is disposed proximate to a voltage sensing unit 50 and includes an upper conductor plate 31, a lower conductor plate 33, and a connection unit 35 electrically connecting a portion of the upper conductor plate 31 and a portion of the lower conductor plate 33.

FIG. 4 extends the illustrated example of FIG. 3 to further include a conducting rod 60.

Referring to FIG. 4, the conducting rod 60 penetrates through the penetration unit 10, and current may flow in either the up direction or down direction through the conducting rod 60. This "conducting rod current" may then be returned through the main return path unit 20 and secondary return path unit 30 as "returning current". The returning current includes a "majority current portion" returned through the main return path unit 20, and a "remaining current portion" returned through the secondary return path unit 30. In other words, according to certain embodiments of the inventive concept, the magnitude of the remaining current portion returned through the secondary return path unit 30 may be less than the magnitude of the majority current portion returned through the main return path unit 20.

As illustrated in FIGS. 3 and 4, the connection unit 35 may include a plurality of columnar conductor holes, where the plurality of columnar conductor holes have a cylindrical shape. However, this arrangement and shape of the conductor holes is a matter of design choice. In other embodiments of the inventive concept, a number of the columnar conductor holes provided in the upper plate 31 and lower plate 33 may have one or more columnar shapes (e.g., circular, elliptical, rectangular, etc.). Further, all or a part of the columnar conductor holes may be a penetration hole, through which the central portion of the columnar shape penetrates, regardless of the shape of the upper surface or the lower surface of the column.

Here, the shape of the columnar conductor holes may be determined by experiment and/or calculation prior to manufacture in order to minimize undesired changes in the before/after electrical characteristics of the plasma processing chamber relative to the insertion of the RF sensing apparatus into a plasma processing chamber including the secondary return path unit 30.

Figure 5:
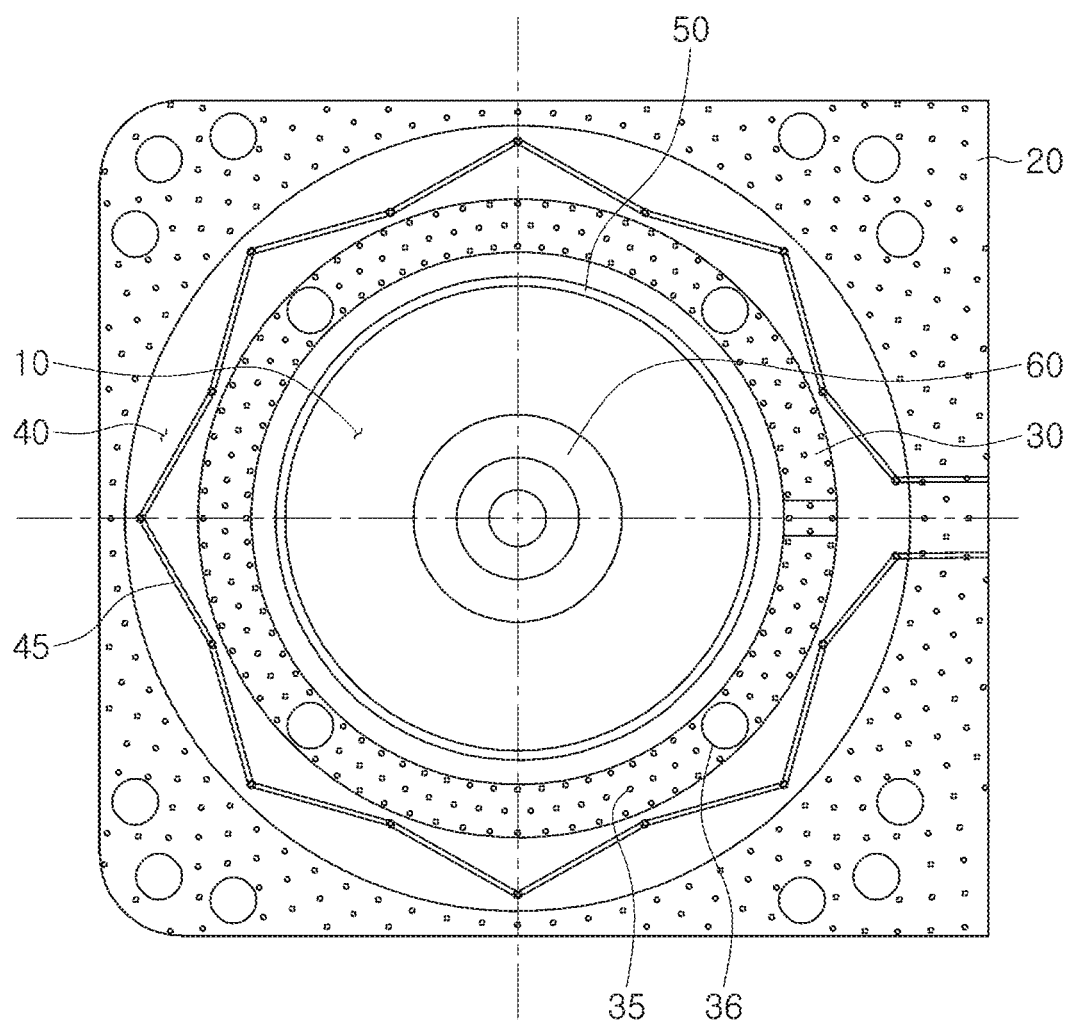
FIG. 5 is a plan view of an RF sensing apparatus of a plasma chamber according to another embodiment of the inventive concept.
Figure 6:
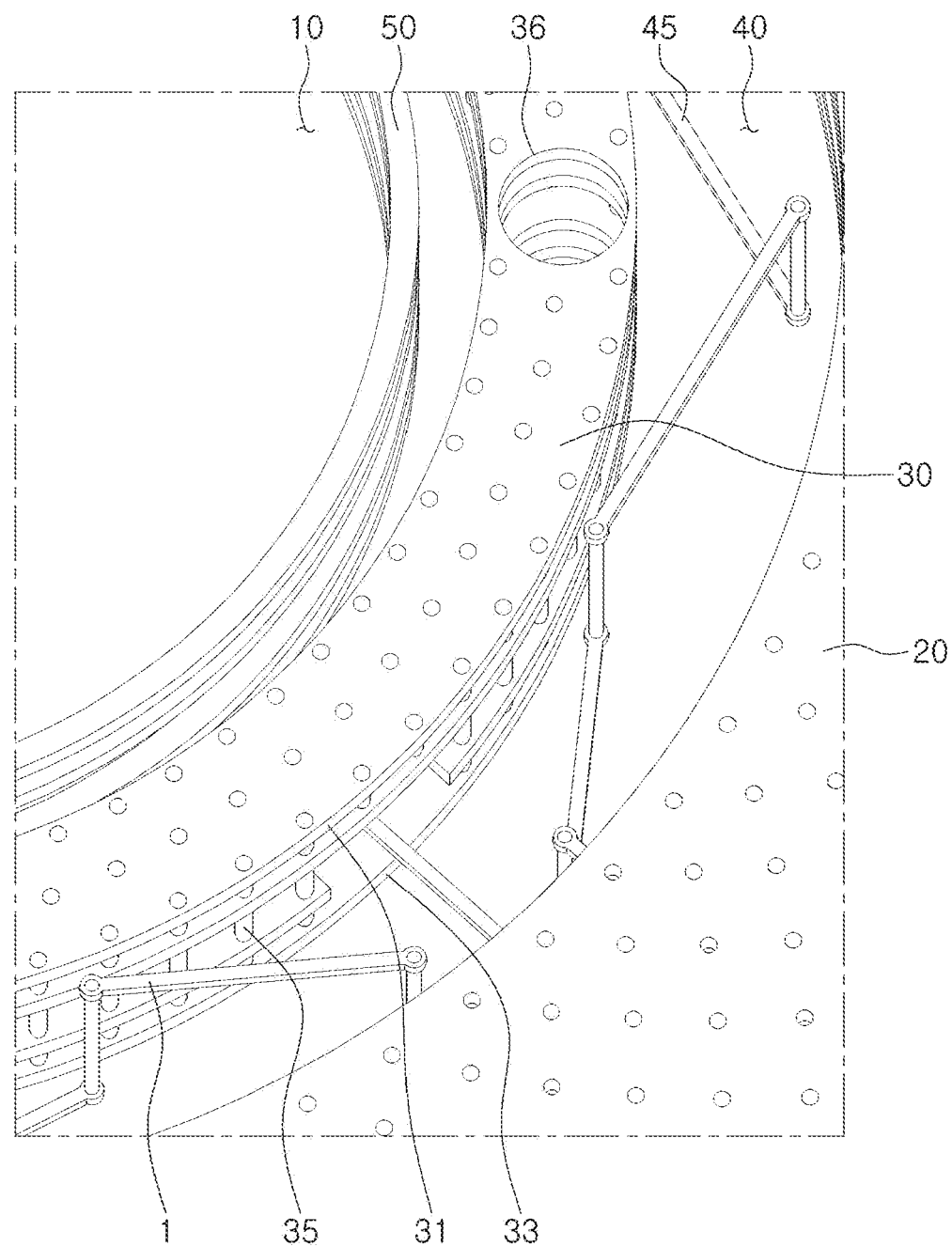
FIG. 6 is a selectively-enlarged partial perspective view of the RF sensing apparatus of FIG. 5.

FIG. 5 is a plan view of an RF sensing apparatus as it may be inserted into a plasma processing chamber according to embodiments of the inventive concept. FIG. 6 is a selectively-enlarged, partial view of the RF sensing apparatus of FIG. 5.

Referring to FIGS. 5 and 6, connection units 35 and 36 may be formed in the secondary return path unit 30 as a plurality of columnar conductor holes having a cylindrical shape of the same or varying radii. As previously noted, the arrangement, number, shape and size of the columnar conductive holes may be determined prior to manufactured using empirical evidence derived from experiments and/or calculations, such that (e.g.,) changes in the impedance for the plasma processing chamber are minimized between before and after conditions relative to the introduction (e.g., mounting or insertion) of the RF sensing apparatus into the plasma processing chamber.

For example, when the radius of a columnar conductor hole is relatively large, a coupling coefficient may be excessively low at a time when current sensing occurs. Alternately or additionally, a careful selection of spacing distance(s) between adjacent columnar conductor holes is required, particularly when columnar conductive holes have different shapes and/or sizes (e.g., elements 35 and 36 in FIGS. 5 and 6). That is, when spacing of columnar conductive holes is relatively dense, a coupling coefficient may be reduced too far at a time when current sensing occurs.

Figure 7:
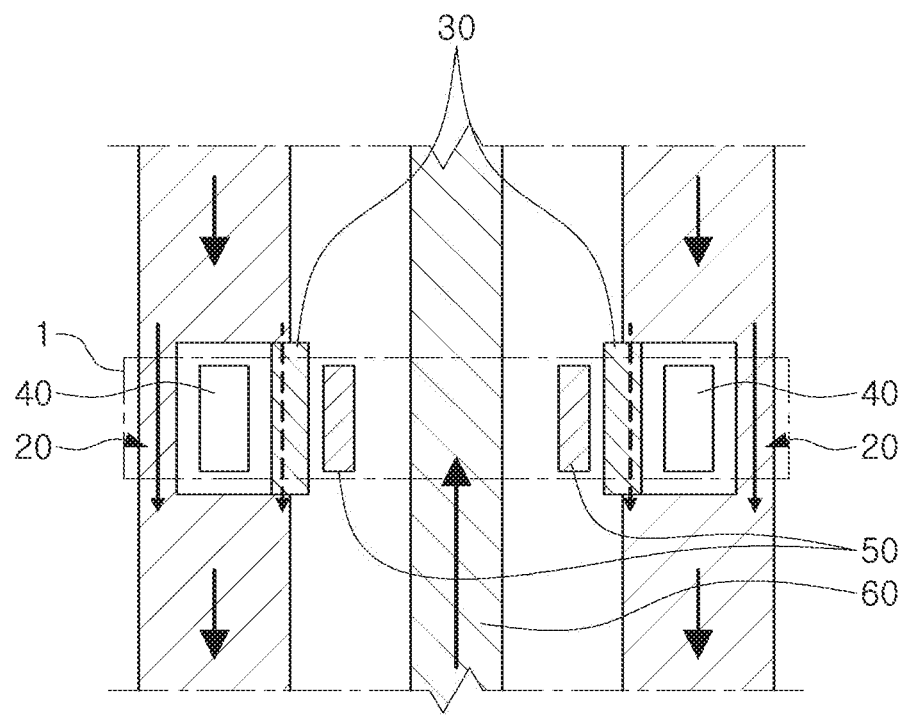
FIGS. 7, 8 and 9 are cross-sectional views of an RF sensing apparatus, as introduced into a plasma processing chamber according to embodiments of the inventive concept.
Figure 8:
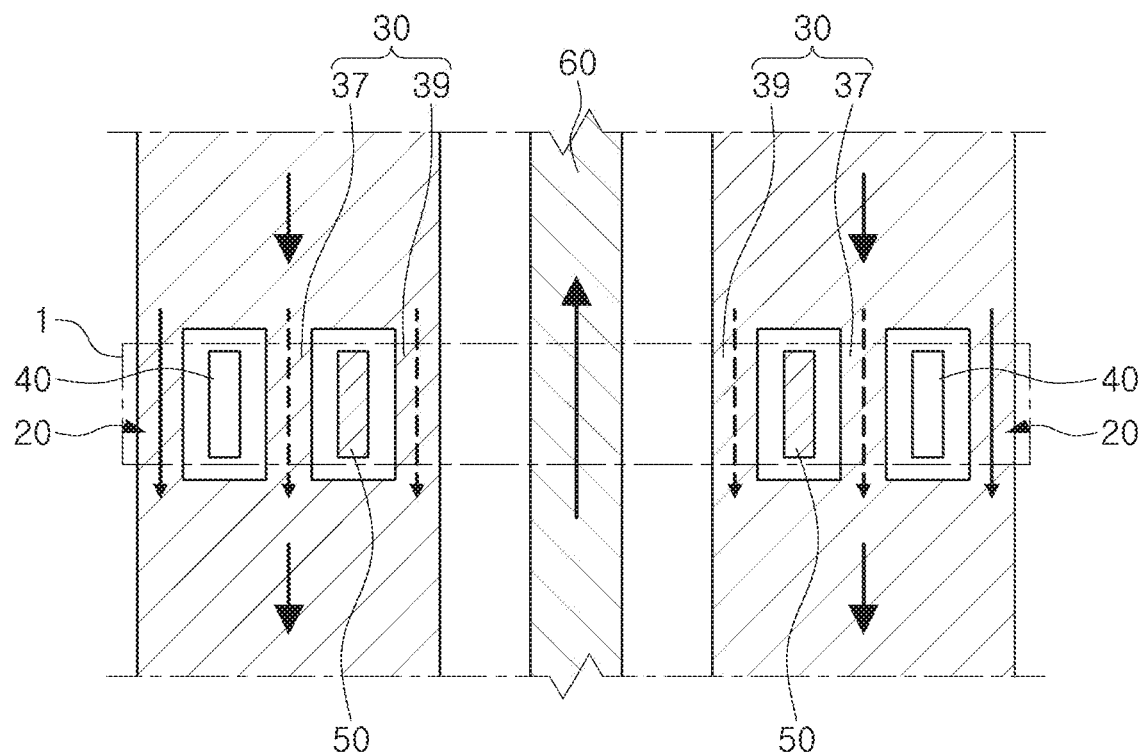
Figure 9:
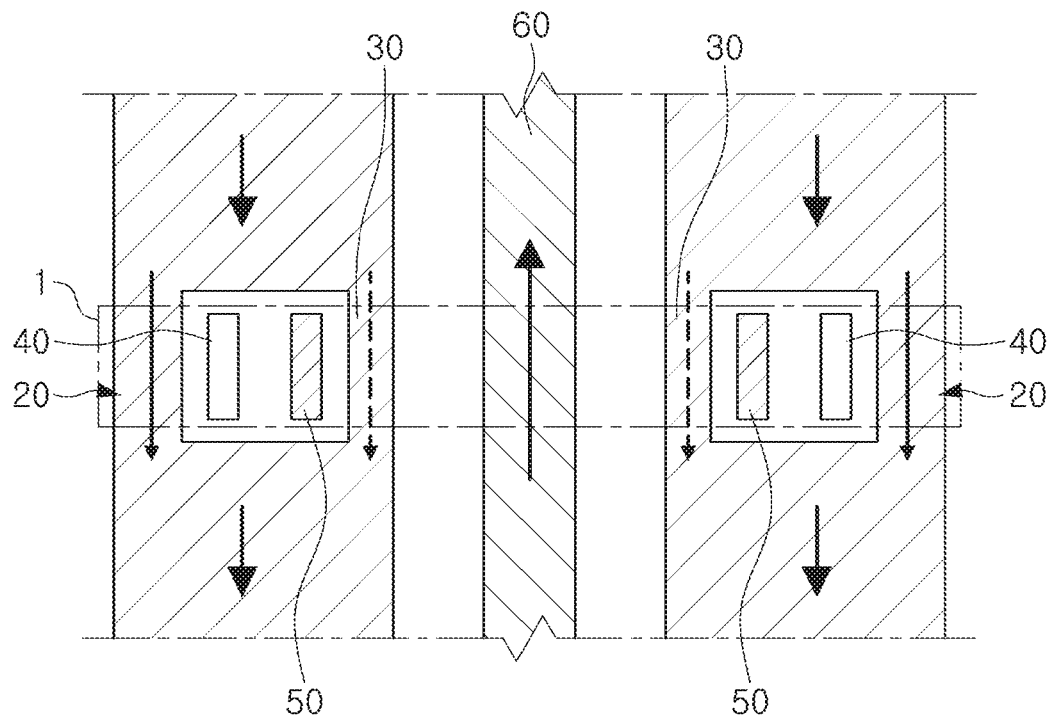

FIGS. 7, 8 and 9 are respective cross-sectional views of an RF sensing apparatus of a plasma chamber according to embodiments of the inventive concept.

In FIGS. 7, 8 and 9, an RF sensing apparatus has been introduced into a plasma chamber 1, and includes the current sensing unit 40 disposed between the main return path unit 20 and the secondary return path unit 30. The voltage sensing unit 50 is disposed between the penetration unit 10 and the secondary return path unit 30.

The configurations illustrated in FIGS. 2, 3, 4, 5 and 6 show generally the same disposition as the embodiment illustrated in FIG. 7. That is, the penetration unit 10, voltage sensing unit 50, secondary return path unit 30, current sensing unit 40, and main return path unit 20 through which the conducting rod 60 is disposed may be provided as shown in FIG. 7. With this configuration, the RF sensing apparatus associated with the plasma chamber 1 according to embodiments of the inventive concept may significantly reduce (or mitigate) the process change rate which may otherwise occur when the RF sensing apparatus is introduced (e.g., inserted or mounted) into the plasma processing chamber. This configuration therefore provides a more accurate measurement information, because the interference phenomenon between the signals being measured is reduced.

Referring to FIG. 8, the secondary return path unit 30 in another embodiment of the inventive concept may include a first secondary return path unit 37 and a second secondary return path unit 39 separated from each other. Here, the current sensing unit 40 may be disposed between the main return path unit 20 and first secondary return path unit 37, and the voltage sensing unit 50 may be disposed between the first secondary return path unit 37 and the second secondary return path unit 39. Accordingly, the penetration unit 10, second secondary return path unit 39, voltage sensing unit 50, first secondary return path unit 37, current sensing unit 40, and main return path unit 20 through which the conducting rod 60 may be inserted, are disposed as shown in FIG. 8.

Referring to FIG. 9, in yet another embodiment of the inventive concept both the current sensing unit 40 and voltage sensing unit 50 are disposed between the main return path unit 20 and the secondary return path unit 30.

Figure 10:
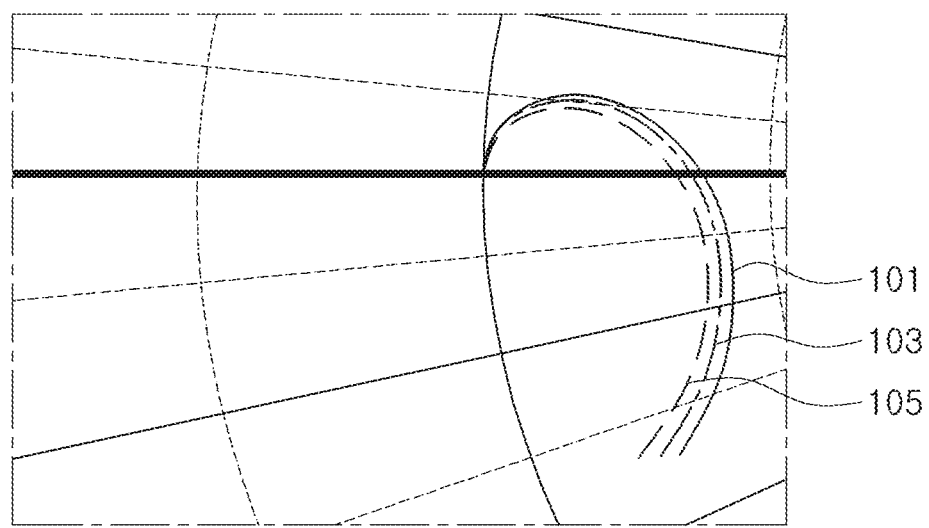
FIG. 10 is a collection of graphs illustrating changes in electrical characteristics due to the introduction of an RF sensing apparatus of the plasma chamber.

FIG. 10 is a graph illustrating changes in electrical characteristics before and after the introduction of a RF sensing apparatus into a plasma processing chamber. Curve 101 of FIG. 10 illustrates an un-changed impedance measured in a range of 100 kHz to 300 kHz before mounting the RF sensing apparatus in a plasma processing chamber. An ideal RF sensing apparatus—one causing no changes in impedance by its introduction—would yield exactly the same impedance characteristic show by curve 101. But this is physically impossible in real practice. Therefore, because the RF sensing apparatus must be introduced to obtain required RF information, it should be a design goal to match as closely as possible the impedance characteristics indicated by the curve 101 by mitigating insofar as possible the corresponding change(s) in the impedance of the plasma processing chamber.

Curve 105 of FIG. 10 illustrates a first change in impedance measured in the range of 100 kHz to 300 kHz when a conventional RF sensing apparatus is introduced in the plasma processing chamber. Here, curve 105 represents a marked change in impedance from the un-changed case of curve 101.

In contrast, the curve 103 illustrates a first change in impedance measured in the range of 100 kHz to 300 kHz when a RF sensing apparatus according to an embodiment of the inventive concept is introduced in the plasma processing chamber. Here, curve 103 represents a notable improvement over the results indicated by curve 105. That is, an RF sensing apparatus according to an embodiment of the inventive concept is introduced into the plasma processing chamber, the resulting electrical characteristics of the plasma processing chamber are materially less changed.

Figure 11A:
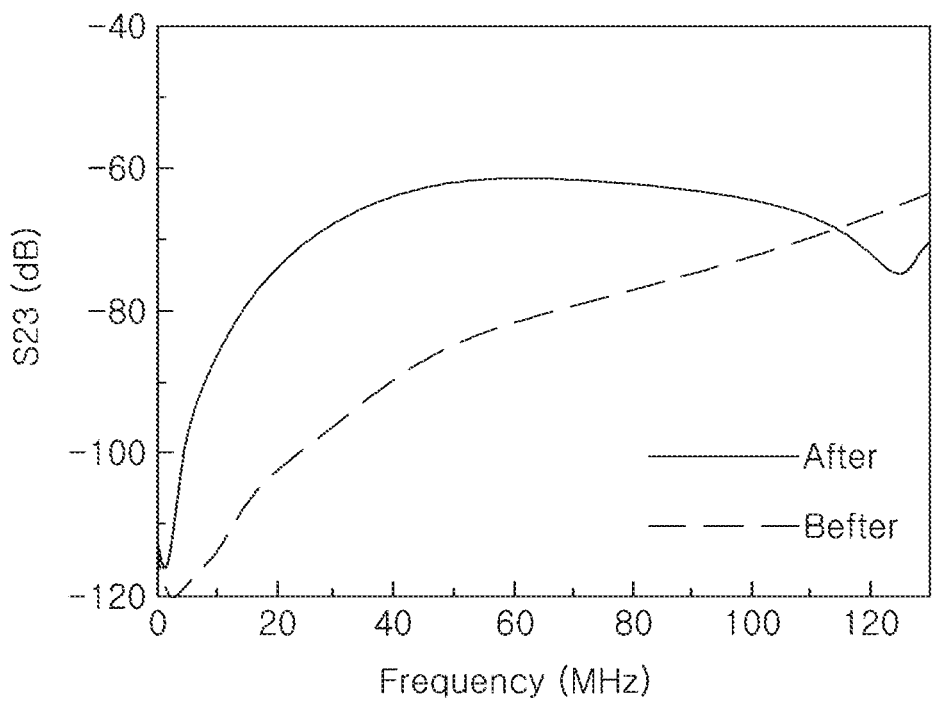
FIG. 11, inclusive of FIGS. 11A and 11B, illustrates cross-talk measurements before and after the introduction of an RF sensing apparatus into a plasma processing chamber.
Figure 11B:
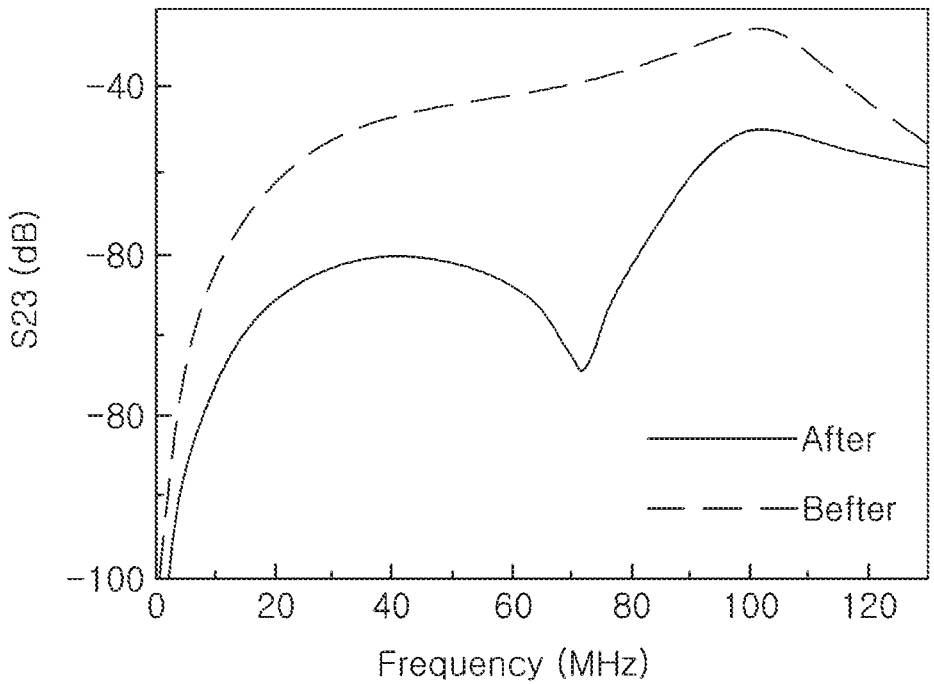
Figure 12:
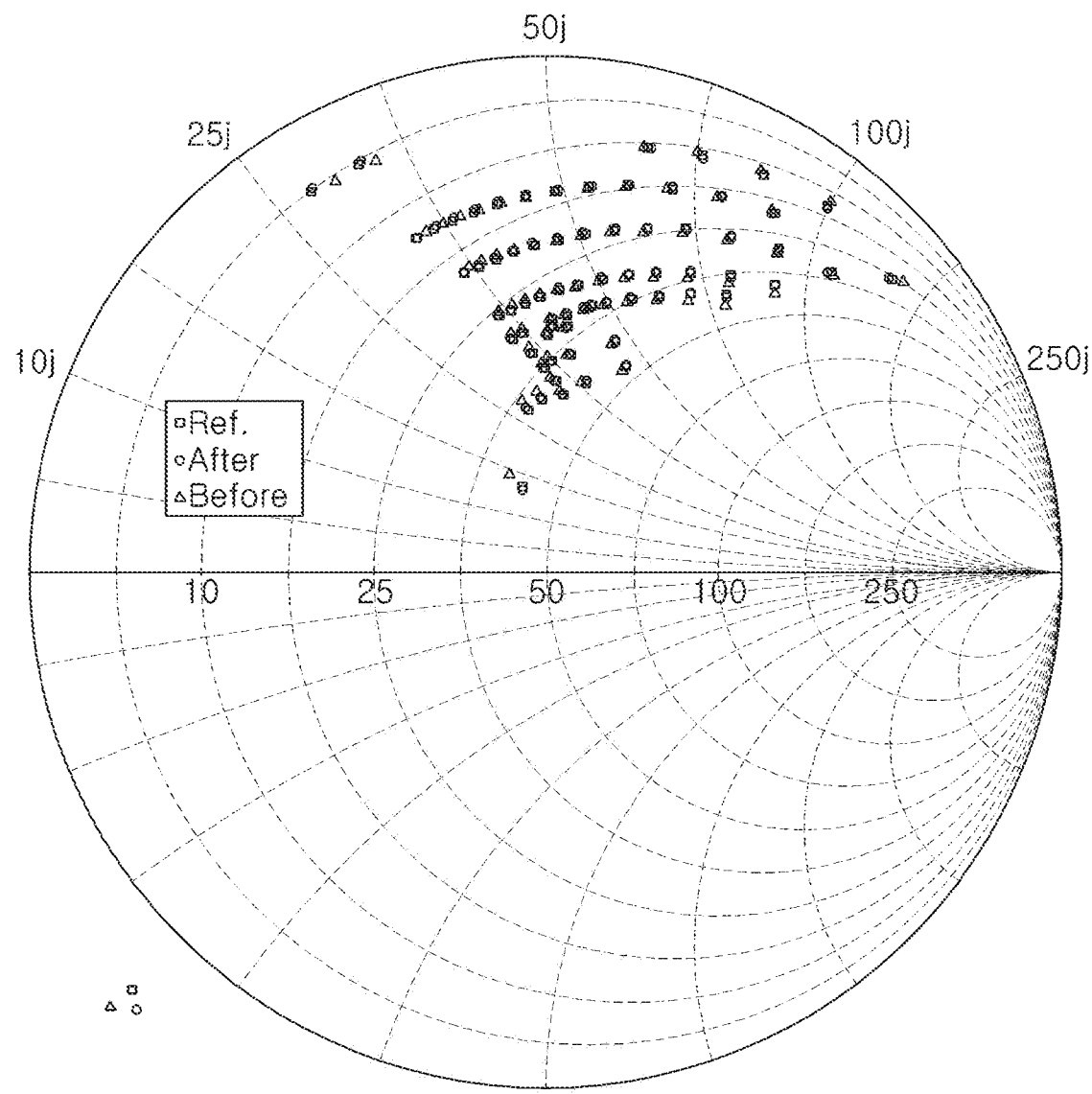
FIG. 12 is a graph illustrating an improvement effect in the accuracy of the main impedance range of the plasma processing chamber in the 60 MHz band.

FIG. 11, inclusive of FIGS. 11A and 11B, illustrates comparative cross-talk measurements before and after introduction of an RF sensing apparatus according to the embodiments of the inventive concept into a plasma processing chamber. FIG. 12 is Smith chart plot further illustrating the improvement in accuracy of the impedance range of the plasma processing chamber in the 60 MHz band.

The cross-talk improvement illustrated in FIGS. 11 and 12 is an incidental effect which appears depending on the existence of the secondary return path unit 30 according to embodiments of the inventive concept. That is, the secondary return path unit 30, such as the example embodiment described with reference to FIG. 7 and the first secondary return path unit 37 described with reference to FIG. 8 serve as a shielding structure for separating the current sensing unit 40 and the voltage sensing unit 50 from each other. Accordingly, the problem in which the accuracy of the measurement parameter is lowered due to interference phenomenon between the measured RF signals is improved. To achieve such an effect, the connection unit included in the secondary return path unit 30 needs to be connected together and grounded. In other words, a shielding effect on a static field between the current sensing unit 40 and the voltage sensing unit 50 may be aimed at by grounding either the upper conductor plate 31 or the lower conductor plate 33 constituting the secondary return path unit 30.

Referring to FIGS. 11A and 11B, it can be seen that cross talk is improved up to the maximum of 30 dB due to such an incidental effect, and referring to FIG. 12, it can be confirmed that the accuracy in the main impedance range of the plasma processing chamber is improved.

As set forth above, an RF sensing apparatus that may be introduced into a plasma processing chamber, results in significantly less change in process conditions than would conventionally be possible. More accurate RF information may therefore be obtained.

While illustrated embodiments have been shown and described above, it will be apparent to those skilled in the art that modifications and variations could be made without departing from the scope of the present inventive concept as defined by the appended claims.

What is claimed is:

1. A Radio Frequency (RF) sensing apparatus of a plasma processing chamber, the RF sensing apparatus comprising:
   a penetration unit configured to receive a conducting rod extending through the penetration unit in an up direction or a down direction, wherein a conducting rod current flows through the conducting rod in one of the up direction and the down direction;
   a main return path unit at least partially encompassing the penetration unit; and
   a secondary return path unit disposed between the penetration unit and the main return path unit, spaced apart from the main return path unit by a separation space, and at least partially surrounding the penetration unit,
   wherein the main return path unit and the secondary return path unit form a return current path through which a return current flows in another one of the up direction and the down direction, and
   wherein the secondary return path unit comprises an upper conductor plate, a lower conductor plate, and a connection unit electrically connecting a portion of the upper conductor plate and a portion of the lower conductor plate.

2. The RF sensing apparatus of claim 1, wherein a majority portion of the return current flows through the main return path unit, and a remaining portion of the return current flows through the secondary return path unit.

3. The RF sensing apparatus of claim 2, wherein the return current is substantially equal in magnitude to the conducting rod current.

4. The RF sensing apparatus of claim 1, further comprising:
   a current sensing unit disposed between the main return path unit and the secondary return path unit; and
   a voltage sensing unit disposed between the penetration unit and the secondary return path unit.

5. The RF sensing apparatus of claim 1, further comprising:
   a current sensing unit disposed between the main return path unit and the secondary return path unit; and
   a voltage sensing unit disposed between the current sensing unit and the secondary return path unit.

6. The RF sensing apparatus of claim 1, wherein the secondary return path unit comprises a first secondary return path unit and a second secondary return path unit, and
   the RF sensing apparatus further comprises:
   a current sensing unit disposed between the main return path unit and the first secondary return path unit; and
   a voltage sensing unit disposed between the first secondary return path unit and the second secondary return path unit.

7. The RF sensing apparatus of claim 1, wherein the connection unit comprises a plurality of columnar conductor holes having at least one size and being separated by at least one spacing distance.

8. The RF sensing apparatus of claim 7, wherein the plurality of columnar conductor holes includes columnar conductive holes having at least two different shapes.

9. The RF sensing apparatus of claim 7, wherein the plurality of columnar conductor holes includes columnar conductive holes having at least two different sizes.

10. A Radio Frequency (RF) sensing apparatus of a plasma processing chamber, the RF sensing apparatus comprising:
    a conducting rod through which a conducting rod current flows in one direction;
    a current return unit that is disposed in the plasma processing chamber and through which a return current flows in another direction opposite to the one direction, that at least partially encompasses the conducting rod, that is physically separated from the conducting rod, and that includes a main return path unit and a secondary return path unit; and
    a current sensing unit disposed between the main return path unit and the secondary return path unit,
    wherein a remaining portion of the return current flowing in the secondary return path unit is less than a majority of the return current flowing in the main return path unit.

11. The RF sensing apparatus of claim 10, further comprising a voltage sensing unit disposed between the conducting rod and the secondary return path unit.

12. The RF sensing apparatus of claim 10, further comprising a voltage sensing unit disposed between the current sensing unit and the secondary return path unit.

13. The RF sensing apparatus of claim 10, wherein the secondary return path unit comprises a first secondary return path unit and a second secondary return path unit, and the current sensing unit is disposed between the main return path unit and the first secondary return path unit, and
    the RF sensing apparatus further comprises a voltage sensing unit disposed between the first secondary return path unit and the second secondary return path unit.

14. The RF sensing apparatus of claim 10, wherein the secondary return path unit comprises an upper conductor plate, a lower conductor plate, and a connection unit electrically connecting a portion of the upper conductor plate and a portion of the lower conductor plate.

15. A Radio Frequency (RF) sensing apparatus of a plasma processing chamber, the RF sensing apparatus comprising:
- a main return path unit having a centrally disposed through-hole in an up direction and a down direction and electrically conducting a measurement current in the up direction or the down direction;
- a secondary return path unit spaced apart from an inner side surface of the main return path unit, having a centrally disposed through-hole in the up direction and the down direction, and electrically conducting a return current in the up direction or the down direction; and
- a coil-type wiring disposed in a space between the main return path unit and the secondary return path unit.

16. The RF sensing apparatus of claim 15, wherein the secondary return path unit comprises an upper conductor plate, a lower conductor plate, and a connection unit electrically connecting a portion of the upper conductor plate and a portion of the lower conductor plate to each other.

17. The RF sensing apparatus of claim 15, wherein a direction of the measurement current flowing through the main return path unit and a direction of the return current flowing through the secondary return path unit are the same, and a magnitude of the return current flowing through the secondary return path unit is less than a magnitude of the measurement current flowing through the main return path unit.

18. The RF sensing apparatus of claim 16, wherein the connection unit comprises a plurality of columnar conductor holes.

19. The RF sensing apparatus of claim 18, wherein the plurality of columnar conductor holes includes columnar conductive holes having at least two different shapes, and the plurality of columnar conductor holes includes columnar conductive holes having at least two different sizes.

* * * * *